United States Patent
Jackson et al.

(10) Patent No.: US 11,953,460 B2
(45) Date of Patent: Apr. 9, 2024

(54) MONOLITHIC HUMIDITY SENSOR DEVICES AND METHODS OF MANUFACTURE

(71) Applicant: Texas Instruments Incorporated, Dallas, TX (US)

(72) Inventors: Ricky Alan Jackson, Richardson, TX (US); Wai Lee, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 209 days.

(21) Appl. No.: 17/709,692

(22) Filed: Mar. 31, 2022

(65) Prior Publication Data
US 2022/0365018 A1   Nov. 17, 2022

Related U.S. Application Data

(60) Provisional application No. 63/186,950, filed on May 11, 2021.

(51) Int. Cl.
| | |
|---|---|
| *G01N 27/22* | (2006.01) |
| *H01L 23/31* | (2006.01) |
| *H01L 23/64* | (2006.01) |

(52) U.S. Cl.
CPC ....... *G01N 27/225* (2013.01); *H01L 23/3171* (2013.01); *H01L 23/642* (2013.01)

(58) Field of Classification Search
CPC ........ G01N 27/00; G01N 27/02; G01N 27/22; G01N 27/223; G01N 27/225; H01L 21/00; H01L 21/70; H01L 21/71; H01L 21/76829; H01L 21/76831; H01L 21/76838; H01L 21/76877; H01L 21/76879; H01L 23/00; H01L 23/28; H01L 23/31; H01L 23/3157; H01L 23/3171; H01L 23/552
USPC .......................... 324/600, 649, 658, 663, 664
See application file for complete search history.

(56) References Cited

U.S. PATENT DOCUMENTS

| | | | |
|---|---|---|---|
| 6,426,562 B2 * | 7/2002 | Farnworth | H01L 24/11 257/781 |
| 11,428,661 B2 * | 8/2022 | Haubold | H01L 21/56 |
| 2022/0113436 A1 * | 4/2022 | Menichelli | G01T 1/241 |

FOREIGN PATENT DOCUMENTS

| | | | | | |
|---|---|---|---|---|---|
| CN | 103076099 A | * | 5/2013 | | G01J 5/00 |
| CN | 105300540 A | * | 2/2016 | | G01N 27/22 |
| CN | 112591706 A | * | 4/2021 | | B81C 1/00246 |
| EP | 2420826 A1 | * | 2/2012 | | G01N 27/225 |

* cited by examiner

*Primary Examiner* — Hoai-An D. Nguyen
(74) *Attorney, Agent, or Firm* — Andrew R. Ralston; Frank D. Cimino

(57) ABSTRACT

Monolithic humidity sensor devices, and methods of manufacture. The devices include circuitry on or over a silicon substrate. A primary passivation barrier is formed over the circuitry with conductive vias therethrough; a capacitor, comprising metal fingers with spaces therebetween, is formed above said primary passivation barrier and electrically coupled by the conductive vias to the circuitry. A secondary passivation barrier is formed over the capacitor. A hygroscopic material layer is formed over the secondary passivation barrier, wherein the capacitor is operable to exhibit a capacitance value responsive to moisture present in the hygroscopic material layer and the circuitry is operable to generate a signal responsive to said capacitance value.

20 Claims, 13 Drawing Sheets

MONOLITHIC HUMIDITY SENSOR DEVICES AND METHODS OF MANUFACTURE

RELATED APPLICATION

This application claims the benefit of U.S. Provisional Patent Application No. 63/186,950, filed May 11, 2021, the disclosure of which is incorporated herein by reference.

TECHNICAL FIELD

This disclosure is directed, in general, to integrated circuits (IC) and, more specifically, but not exclusively, to monolithic humidity sensor devices and methods of manufacture thereof.

BACKGROUND

Humidity sensors can be found in many products, ranging from smart home assistants to wireless base stations. The function of these sensors allows careful monitoring of environmental conditions ranging from in-home use (e.g., alerting the user of any alarming conditions that may impact air quality) to monitoring expensive wireless equipment during events in weather that can impact communication and equipment performance. Aside from such applications, humidity sensors are also found in refrigeration monitoring in cold-chain transports (ensuring shipped perishables arrive fresh), clothing manufacturing processes, smart thermostats, inkjet printers, HVAC systems, and surveillance cameras.

Traditional methods for recording humidity include the use of large mechanical hygrometers, which largely rely on measurements of temperature, pressure, thermal conductivity, or mass change during moisture absorption. While such traditional devices provide highly detailed data after calibration, advances in technology have paved the path towards the use of a significantly smaller alternative of incorporating a humidity-sensing device in an integrated circuit (IC). As Moore's Law has predicted the scaling of transistors in semiconductor technologies, it has also enabled the microminiaturization of sensing elements, which are now fairly commonplace in ICs.

Largely due to their chemical and physical properties over a wide range of characteristics, polymer thin film technologies are the primary sensing components in most humidity-sensing ICs. Some capacitive-type polymer humidity sensors include a thin film polymer dielectric between two conductive electrodes. A hygroscopic aspect of the dielectric means that it can absorb moisture from the ambient environment. When no moisture is present in the sensor, the polymer dielectric constant and the sensor geometry determine the value of the capacitance. As humidity increases, the polymer absorbs water molecules from the surrounding (air) environment, which alters the dielectric constant of the capacitor sensor.

Relative humidity is a function of water vapor pressure and ambient temperature. At typical room temperatures, the dielectric constant in the sensor is higher than the constant of the dry sensor dielectric material. This humidity in the environment leads to absorption or desorption of moisture by the sensor and an increase or decrease, respectively, in sensor capacitance. There is a direct relationship between the relative humidity, the amount of moisture in the sensor, and the sensor capacitance. Because of this relationship, the dielectric material varies at a rate that is related to the change in relative humidity; this variation causes either absorption or desorption of moisture into or out of the polymer. Such variation in the dielectric effects a change in capacitance, which can be measured with an electronic circuit and correlated to known values to determine the ambient relative humidity. Such electronic circuits can include, for example, an integrated circuit (IC), which may include a set of electronic circuits on a semiconductor die, usually silicon. ICs, however, can be particularly susceptible to degradation if exposed to moisture. Accordingly, there is a need in the art for IC humidity sensor device designs, and methods of manufacture thereof, the limit or eliminate the potential for degradation due to moisture ingression.

SUMMARY

In order to address deficiencies of the baseline implementations, disclosed are monolithic humidity sensor devices and methods of manufacture. The devices include circuitry on or over a silicon substrate. A primary passivation barrier is formed over the circuitry with conductive vias therethrough. A capacitor, comprising metal fingers with spaces therebetween, is formed above the primary passivation barrier and electrically coupled by the conductive vias to the circuitry. A secondary passivation barrier is formed over the capacitor. A hygroscopic material layer is then formed over the secondary passivation barrier, wherein the capacitor is operable to exhibit a capacitance value responsive to moisture present in the hygroscopic material layer and the circuitry is operable to generate a signal responsive to the capacitance value.

In one example, the primary passivation barrier comprises a silicon oxynitride layer between upper and lower silicone oxide layers. In a related example, the primary passivation barrier under the spaces can be advantageously recessed to a level below bottom surfaces of the metal fingers of the capacitor. The secondary passivation barrier, formed over the capacitor, can be or include, for example, a layer of silicon oxide between a layer of silicon nitride and the metal fingers. As with the primary passivation barrier, the upper silicone oxide layer under the spaces can be recessed to a level below bottom surfaces of the metal fingers.

The device can further include a metal shield layer above the circuitry, wherein the metal shield layer surrounds at least a portion of the capacitor. In an example, the metal shield layer is formed from the same metal layer as the metal fingers of the capacitor.

The foregoing has outlined, rather broadly, the general features of the disclosed examples so that those skilled in the art may better understand the detailed description of the examples that follows. Those skilled in the art should appreciate that they can readily use the disclosed conception and example as a basis for designing or modifying other structures and methods for carrying out the same purposes of the present disclosure. Those skilled in the art should also realize that such equivalent constructions do not depart from the spirit and scope of the disclosure in its broadest form.

BRIEF DESCRIPTION OF THE DRAWINGS

For a more complete understanding of the disclosure, reference is made to the following detailed description taken in conjunction with the accompanying drawings, in which.

DETAILED DESCRIPTION

Figure 1:
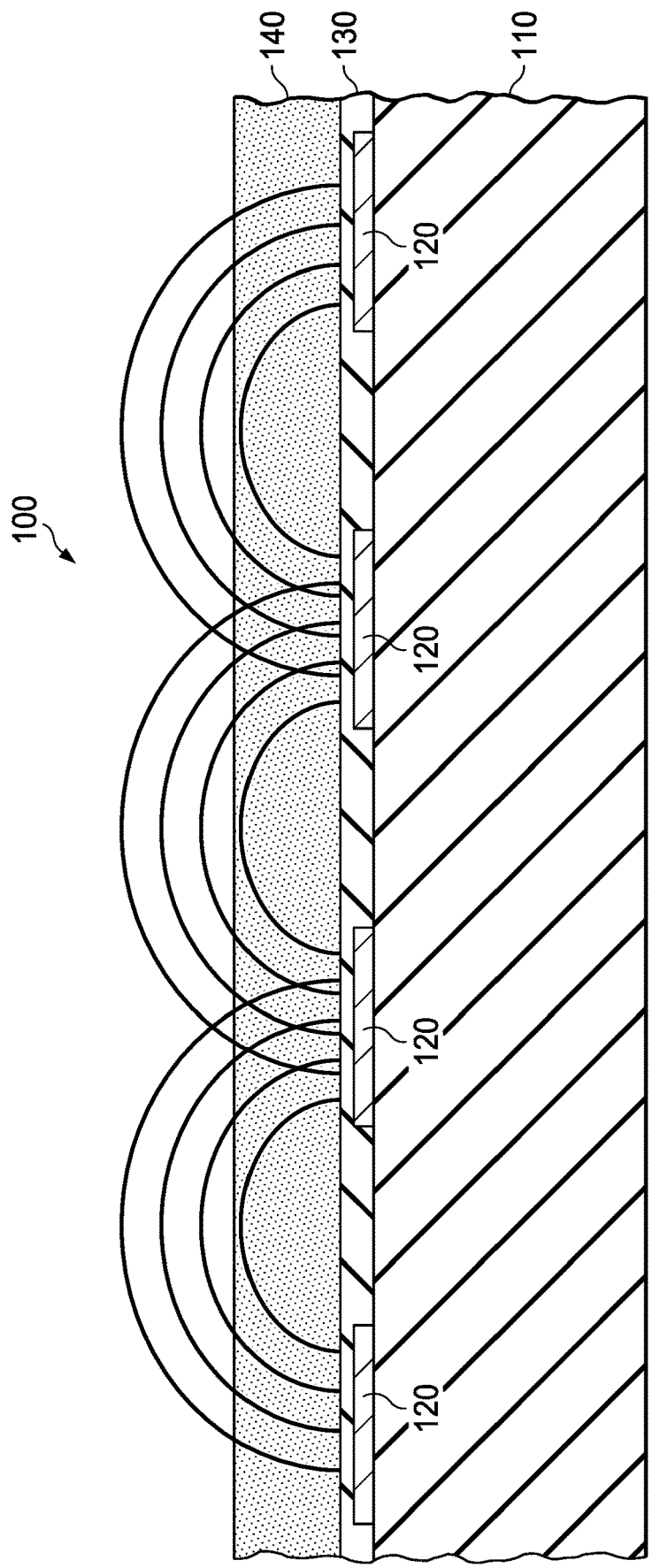
FIG. 1 illustrates a cross-sectional view of a capacitive-type polymer humidity sensor.

Referring first to FIG. 1, illustrated is a cross-sectional view of a baseline capacitive-type polymer humidity sensor 100. The humidity sensor 100 includes a capacitor formed on a substrate 110; the capacitor can be, for example, a fringe-type capacitor having interdigitated metal fingers 120 with spaces therebetween. The capacitor fingers 120 are covered by a passivation layer 130 which protects the metal fingers 120 from the environment, particularly moisture. A hygroscopic dielectric material 140 is formed over the passivation layer 130. Most capacitive-type humidity sensors use a thermoset resin or polymer as the hygroscopic dielectric material, with a typical dielectric constant ranging from 2 to 15. When no moisture is present in the hygroscopic dielectric material 140 both this constant and the sensor geometry determine the value of capacitance. At normal room temperature, the dielectric constant of water vapor has a value of about 80, a value typically much greater than the constant of the hygroscopic dielectric material 140. Therefore, absorption of water vapor by the hygroscopic dielectric material 140 results in an increase in sensor capacitance; the change in capacitance can be utilized to generate a signal representative of the ambient relative humidity. For the baseline humidity sensor 100, however, the hygroscopic dielectric material 140 is not disposed between the metal fingers 120, which can result in a low signal value. To increase the signal value, the size of the capacitor may be increased, but doing so is undesirable for applications where the size of the sensor should be as small as possible, such as sensors to be monolithically formed with an integrated circuit.

Figure 2A:
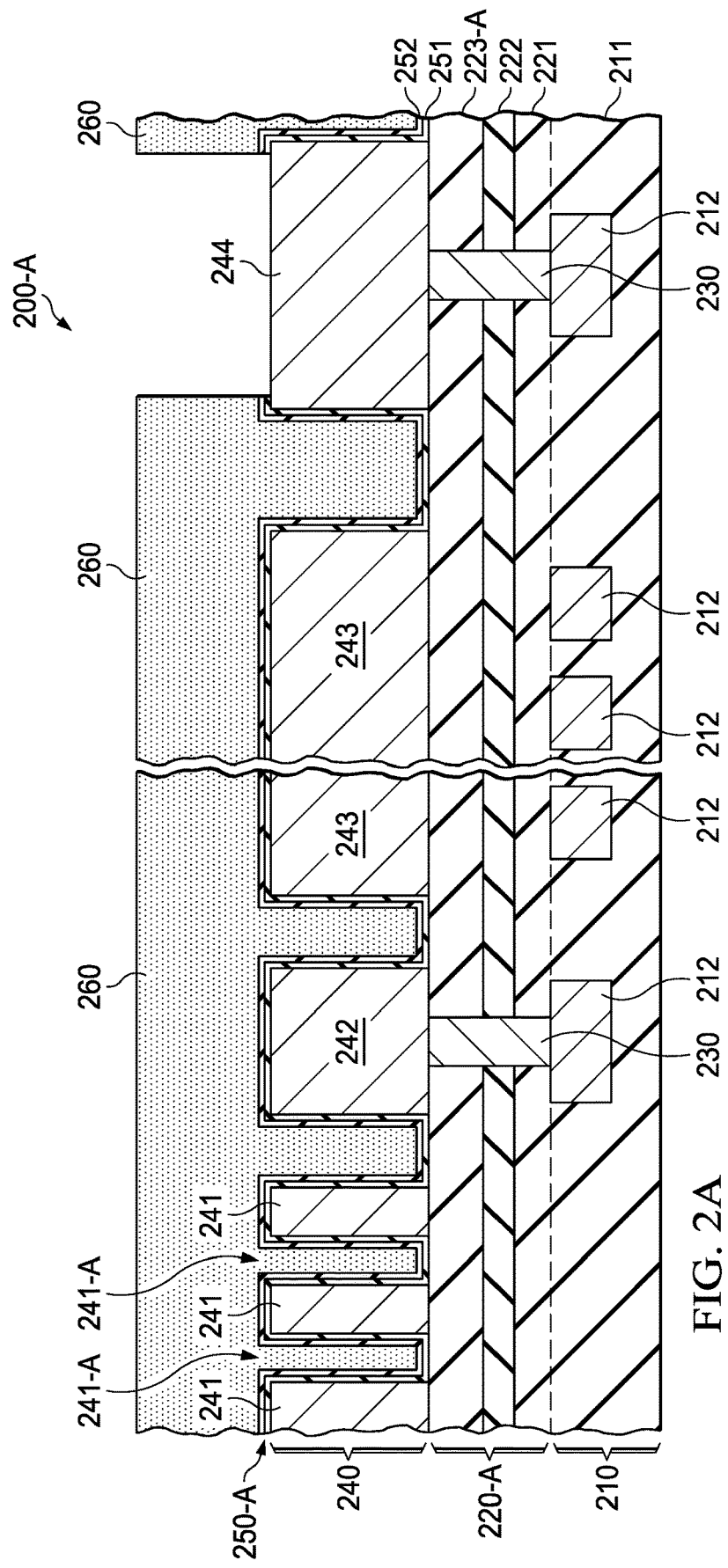
FIGS. 2A and 2B illustrate cross-sectional views of example monolithic humidity sensor devices.
Figure 2B:
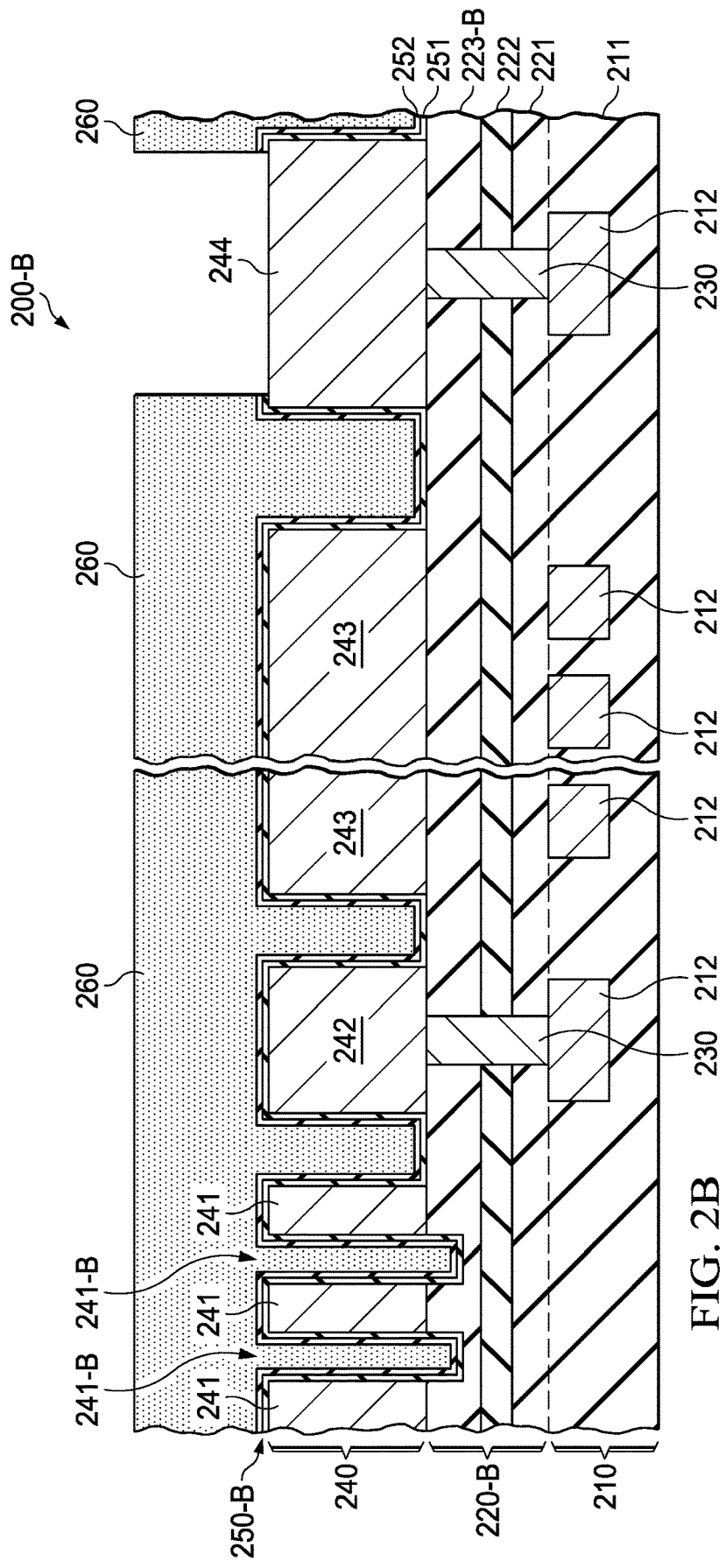

Turning now to FIGS. 2A and 2B, illustrated are cross-sectional views of example monolithic humidity sensor devices 200-A and 200-B, respectively; an example method of fabricating monolithic humidity sensor devices will be presented hereinafter with reference to FIGS. 3A through 3L. The monolithic humidity sensors 200-A and 200-B each integrate a capacitive-type humidity sensor with circuitry that is operable to generate a signal responsive to the capacitance value of the sensor, wherein the signal is representative of the relative humidity of the ambient environment proximate the sensor. Such circuitry can be, for example, an integrated circuit (IC), which can be particularly susceptible to degradation if exposed to moisture; the example humidity sensor devices 200-A and 200-B are constructed such that the circuitry is sufficiently isolated to avoid such degradation.

With reference to FIG. 2A, device 200-A, a circuitry layer 210 is formed within or over a silicon substrate 211, which can be formed from, for example, silicon oxide. The circuitry layer (such as an integrated circuit) includes metal interconnects 212. A primary passivation barrier 220-A (also referred to herein as a planarized passivation layer) is then formed over the circuitry layer/metal interconnects 212. The primary passivation barrier 220-A can be formed from one or more layers; at least one layer may be a dielectric moisture barrier, such as silicon oxynitride (SiON). Alternatively, one or more of the layers could be silicon nitride or aluminum oxide. For example, the primary passivation barrier 220-A can comprise a silicon oxynitride (SiON) layer 222 between first and second silicon dioxide ($SiO_2$) layers 221, 223-A. One or more conductive vias 230 (also referred to herein as vertical interconnections) are formed through the primary passivation barrier 220-A. The conductive vias 230 are preferably formed from tungsten (W), which is resistant to oxidation and corrosion and is a good moisture barrier. A barrier metal layer of titanium (Ti) and/or titanium nitride (TiN) (not shown), can first be formed within openings in the primary passivation barrier 220-A which may then be filed with tungsten to form the conductive vias 230. The conductive vias 230 provide a connection to at least a capacitor formed over the primary passivation barrier 220-A.

A metal layer 240, over the primary passivation barrier 220A, is formed into at least a capacitor. The capacitor can be, for example, an interdigitated capacitor including a plurality of metal fingers 241 (three shown; also referred to herein as metal lines) configured as a first metal finger 241 of a first capacitor electrode between second and third metal fingers 241 of a second capacitator with spaces 241-A therebetween. The metal layer 240 can also be utilized to form capacitor terminals 242 (one shown), which connect to the metal fingers 241. The capacitor terminals are coupled by conductive vias 230 to metal interconnects 212 within the circuitry layer 210.

Figure 2C:
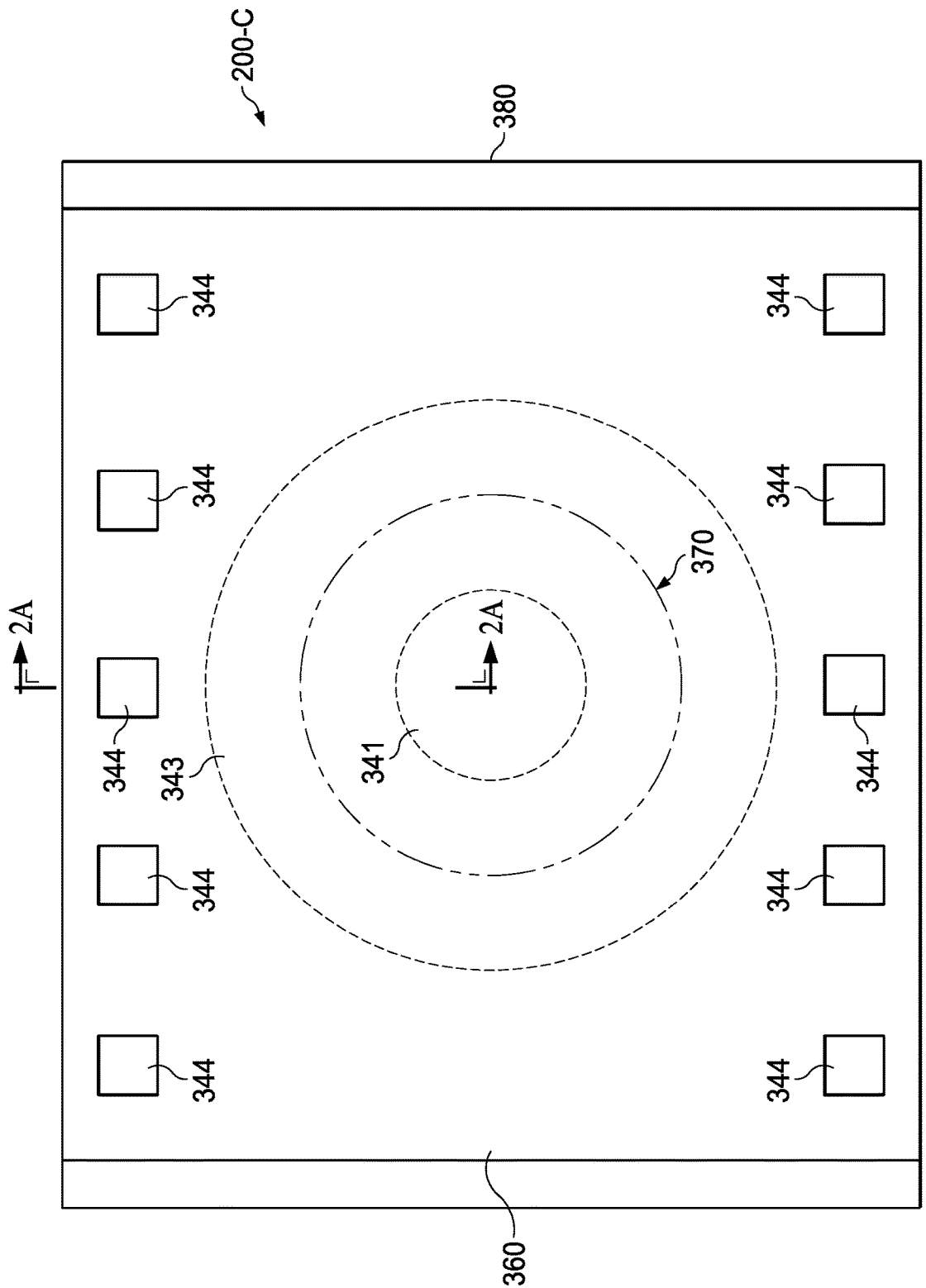
FIG. 2C illustrates a top-down view of an example monolithic humidity sensor; and, FIGS. 3A through 3L illustrate steps of a method of forming a monolithic humidity sensor device as illustrated in FIG. 2A or 2B.

As will be shown and described with respect to FIG. 2C, at least a portion of device 200-A will be exposed to the ambient environment, including light that could interfere with the operation of electronic devices formed in the circuitry layer 210. To block such light, metal layer 240 can be further formed into a metal shield 243 to protect electronic devices below the shield within circuitry layer 210. The metal layer 240 can further be formed into bond pads 244 (one shown) which, like capacitor terminals 242, are coupled by conductive vias 230 to metal interconnects 212 within the circuitry layer 210.

A secondary passivation barrier 250-A (also referred to herein as a dielectric moisture barrier layer) is continuously and conformally formed over the metal layer 240, subsequent to forming the metal fingers 241 and capacitor terminals 242, as well as metal shield 243 and bond pads 244. The secondary passivation barrier 250-A also covers the primary passivation barrier 220-A underlying the spaces 241-A between the metal fingers 241. The secondary passivation barrier 250-A can include multiple layers. For example, a first layer of silicon oxide 251 and a second layer of silicon nitride 252.

A hygroscopic material layer 260, such as polyimide (PI), is then formed over the secondary passivation barrier 250-A, covering at least the metal fingers 241 and filling the spaces 241-A therebetween. The hygroscopic material layer 260 can further cover the metal shield 243, and an opening may be formed over bond pads 244 to allow electrical contact. The capacitor is operable to exhibit a capacitance value responsive to moisture present in the hygroscopic material layer 260. The circuitry layer 210 contains a suitable circuit, coupled to the capacitor through the conductive vias 230, that is operable to generate a signal responsive to the capacitance value.

Turning now to FIG. 2B, the device 200-B is substantially similar to device 200-A. The only difference is that the primary passivation barrier 220-B under the spaces 241-B is recessed to a level below the bottom surfaces of the metal fingers 241. As such, the secondary passivation barrier 250-B underlying the spaces 241-B is also recessed to a level below the bottom surfaces of the metal fingers 241. This variation advantageously moves the interface between the hygroscopic material layer 260 and the secondary passivation layer 250-B below the high-capacitance field between the metal fingers 241, based on the understanding that polymer defects in a high-strain region (such as the corners of spaces 241-A) can trap moisture (which would cause variability in measurement of humidity). Thus, for device 200-B, the corners of spaces 241-B are positioned below the high-capacitance field directly between metal fingers 241, which may reduce negative effects from potential moisture trapped in that region.

Next, reference is made to FIG. 2C, which illustrates a top-down view of an example monolithic humidity sensor 200-C, having a periphery 380 that can define the edge of a die scribe seal. The monolithic humidity sensor 200-C is representative of a sensor, such as 200-A, to be housed in a conventional IC package, such as a plastic or ceramic dual in-line package (DIP). The cutline 2A identifies a cross-sectional view of sensor 200-A (as illustrated in FIG. 2A) wherein the capacitive humidity sensor including by metal fingers 241 is positioned within central region 341 and bond pads 244 in FIG. 2A correspond to bond pads 344 in FIG. 2C. Similarly, the metal shield 243 in FIG. 2A corresponds to metal shield 343 in FIG. 2C, which is under the hygroscopic material layer 360, corresponding to hygroscopic material layer 260 in FIG. 2A. Because the capacitive humidity sensor formed by the interdigitated capacitor metal fingers 241 and hygroscopic material layer 260 must be exposed to the ambient environment, the package in which sensor 200-C is to be packaged has an opening defined by package mold opening boundary 370.

Turning now to FIGS. 3A through 3L, illustrated are the steps of a method of forming a monolithic humidity sensor device, such as device 200-A illustrated in FIG. 2A. Those skilled in the art will appreciate the changes necessary to form the alternative example 200-B illustrated in FIG. 2B. Starting with a base structure 300-A illustrated in FIG. 3A, each successive figure illustrates the addition or removal of one or more layers of material, or portions thereof, to arrive at a final device structure 300-L illustrated in FIG. 3L. Each step of the method can be implemented utilizing, for example, conventional integrated circuit manufacturing processes.

Figure 3A:
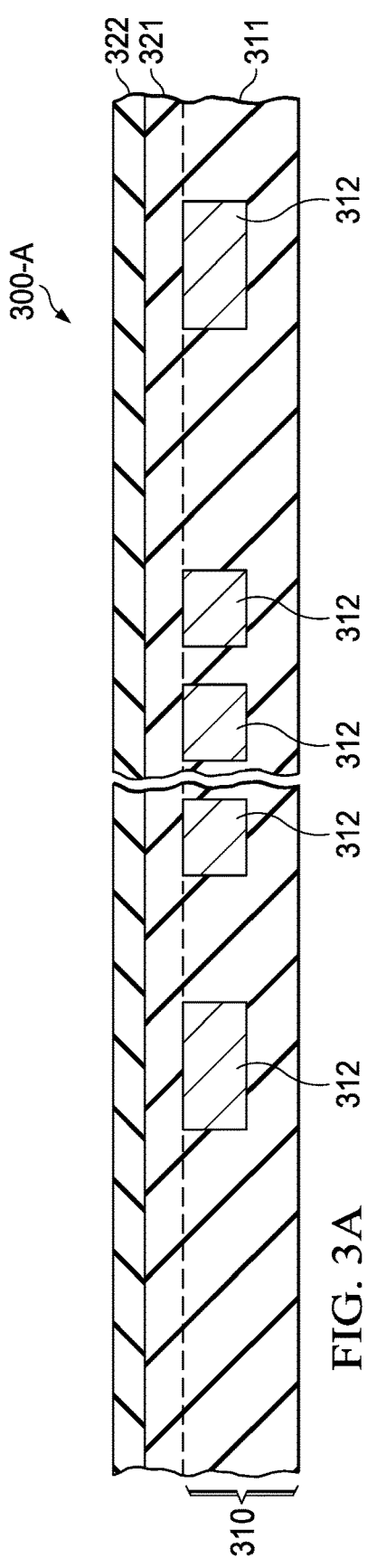

First, with reference to FIG. 3A, base structure 300-A includes circuitry layer 310 formed within or over a silicon substrate 311, which can be formed from, for example, silicon dioxide as known in the art. The circuitry layer (such as an integrated circuit) includes metal interconnects 312. A primary passivation barrier 320 (also referred to herein as a planarized passivation layer) is then formed over the circuitry layer/metal interconnects 312. The primary passivation barrier, which is formed at least by a conventional baseline passivation layer over the circuitry layer, can be formed from multiple layers. At least one layer should be a good dielectric moisture barrier. The base structure 300-A, for example, includes a layer of silicon dioxide (SiFt) 321 formed over the metal interconnects 312 of the circuitry layer 310. A layer of silicon oxynitride (SiON) 322 is then deposited over the layer of silicon dioxide (SiFt) 321, completing the baseline passivation. The subsequent steps, illustrated and described with reference to FIGS. 3B through 3L, provide the means to form a monolithic humidity sensor device based on the base structure 300-A.

Figure 3B:
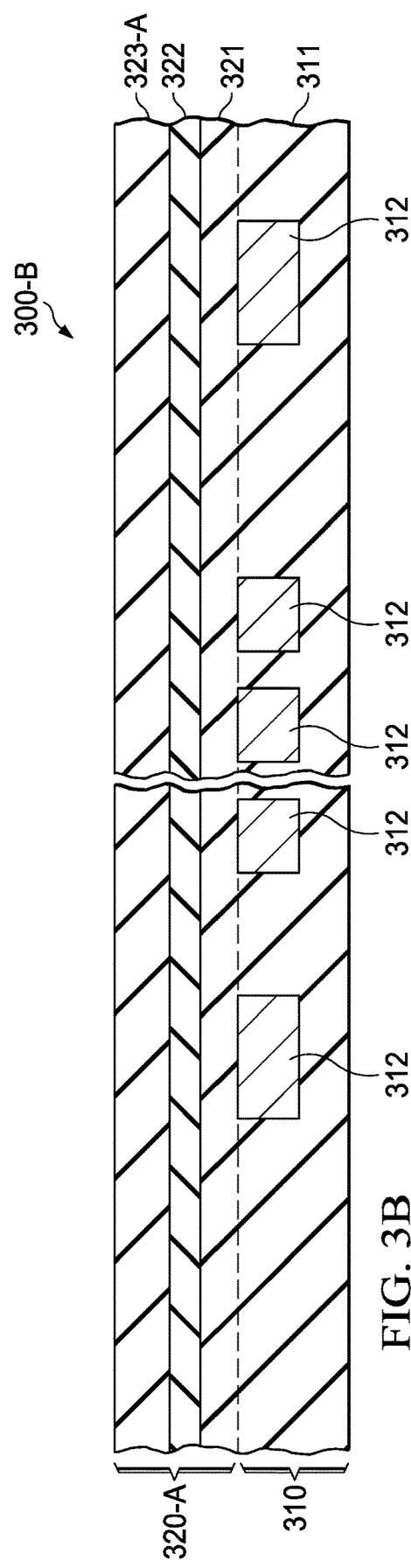

Turning now to FIG. 3B, a second layer of silicon dioxide (SiFt) 323-A is formed over the layer of silicon oxynitride (SiON) 322 of base structure 300-A to form intermediate device 300-B. Hereinafter, the combination of silicon dioxide (SiFt) layer 323-A, silicon oxynitride (SiON) layer 322, and silicon dioxide (SiFt) layer 321, will be referred to as primary passivation layer 320-A. Alternatively, one or more of the layers of the primary passivation barrier 320-A can be silicon nitride or aluminum oxide.

Figure 3C:
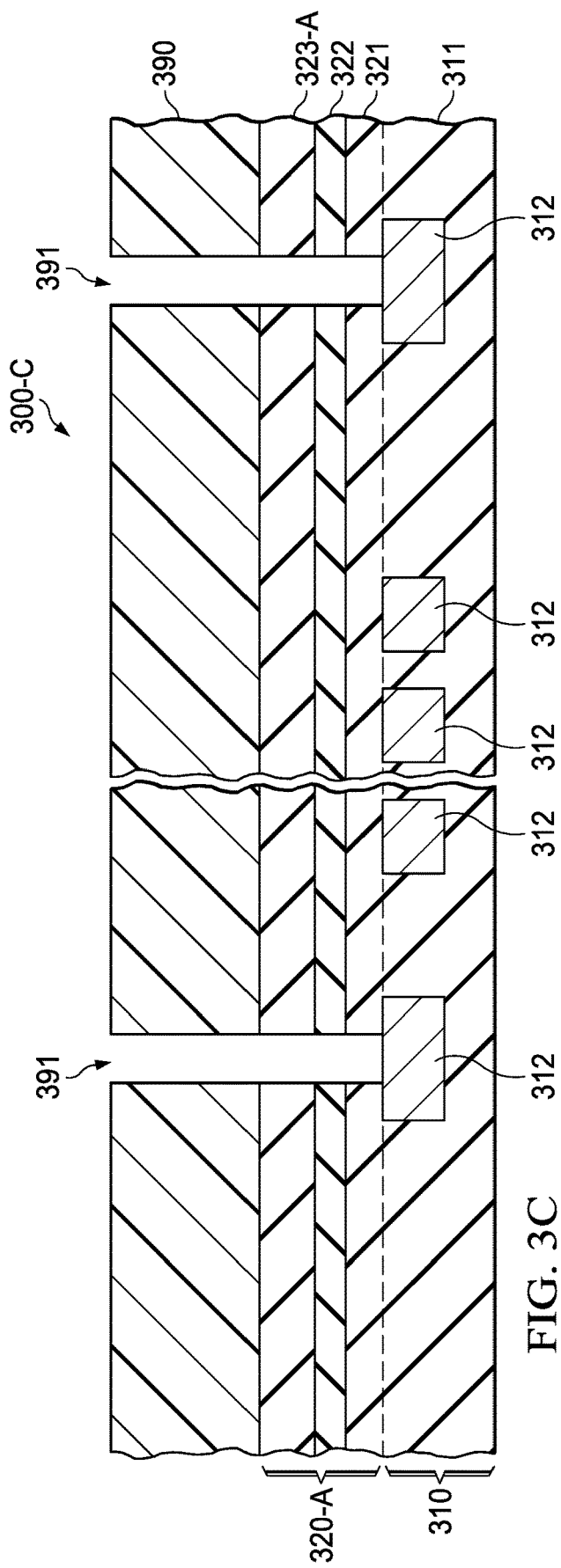
Figure 3D:
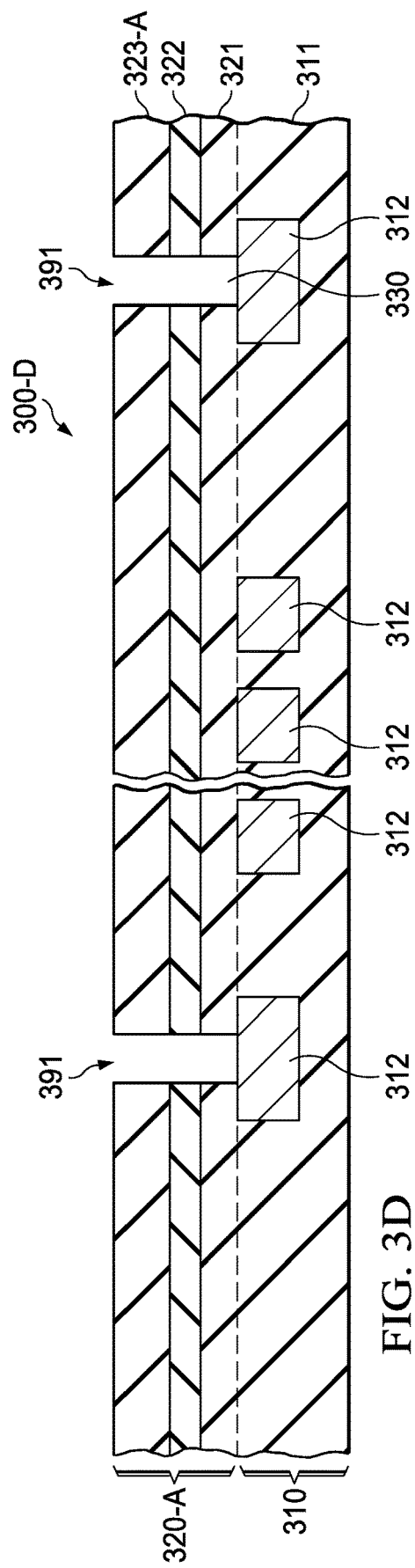

Next, as illustrated in FIG. 3C, a photoresist 390 is layered over the second layer of silicon dioxide (SiFt) 323-A and then plasma etched to form openings 391 through the photoresist 390 and primary passivation layer 320-A to metal interconnects 312 of the circuitry layer 310, forming intermediate device 300-C. Next, as illustrated in FIG. 3D, the photoresist 390 is removed from intermediate device 300-C, forming intermediate device 300-D.

Figure 3E:
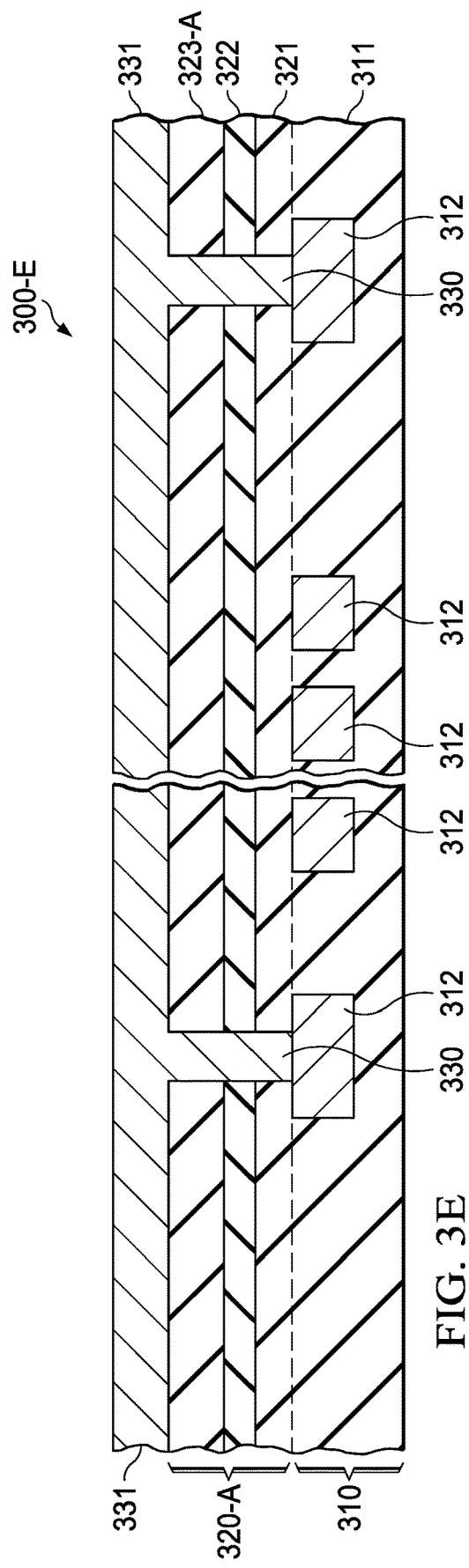
Figure 3F:
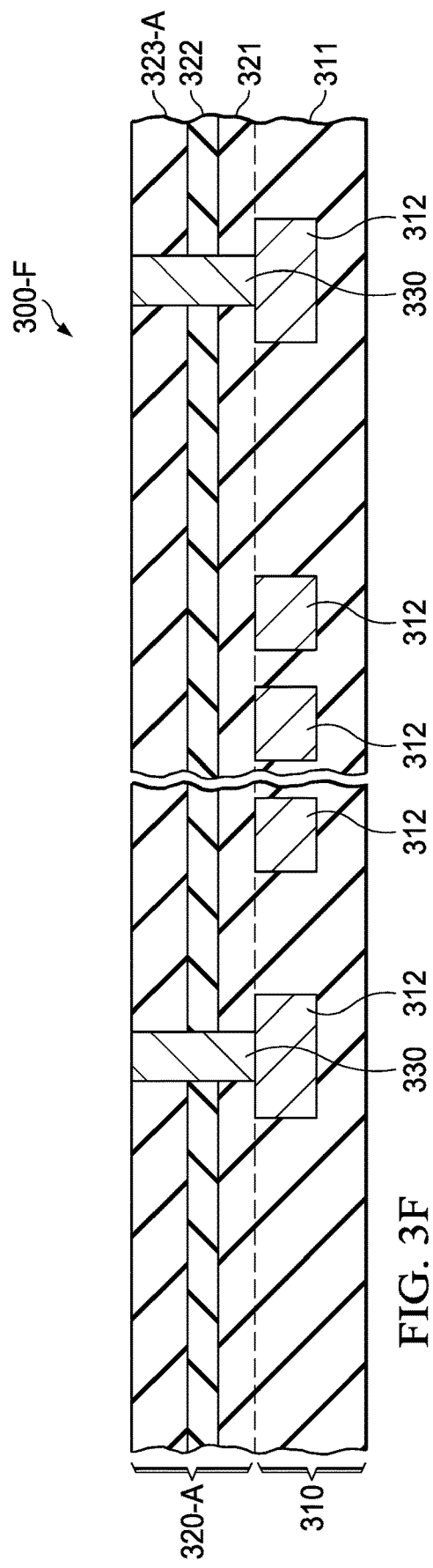

In the next step, illustrated in FIG. 3E, a tungsten layer 331 is deposited on intermediate device 300-D as an intermediate step to form one or more conductive vias (or "vertical interconnections") 330 to metal interconnects 312; this step yields intermediate device 300-E. A barrier metal layer of titanium (Ti) and/or titanium nitride (TiN) (not shown), can first be formed over the primary passivation barrier 320-A and then covered with tungsten (W) to form the conductive vias 330. Next, as illustrated in FIG. 3F, the tungsten layer 331 (and underlying barrier metal layer, if utilized) above the primary passivation layer 320-A is mechanically polished off of intermediate device 300-E down to the upper level of the primary passivation layer 320-A, leaving the one or more conductive vias 330 to provide a conductive path to metal interconnects 312. This step yields intermediate device 300-F.

Figure 3G:
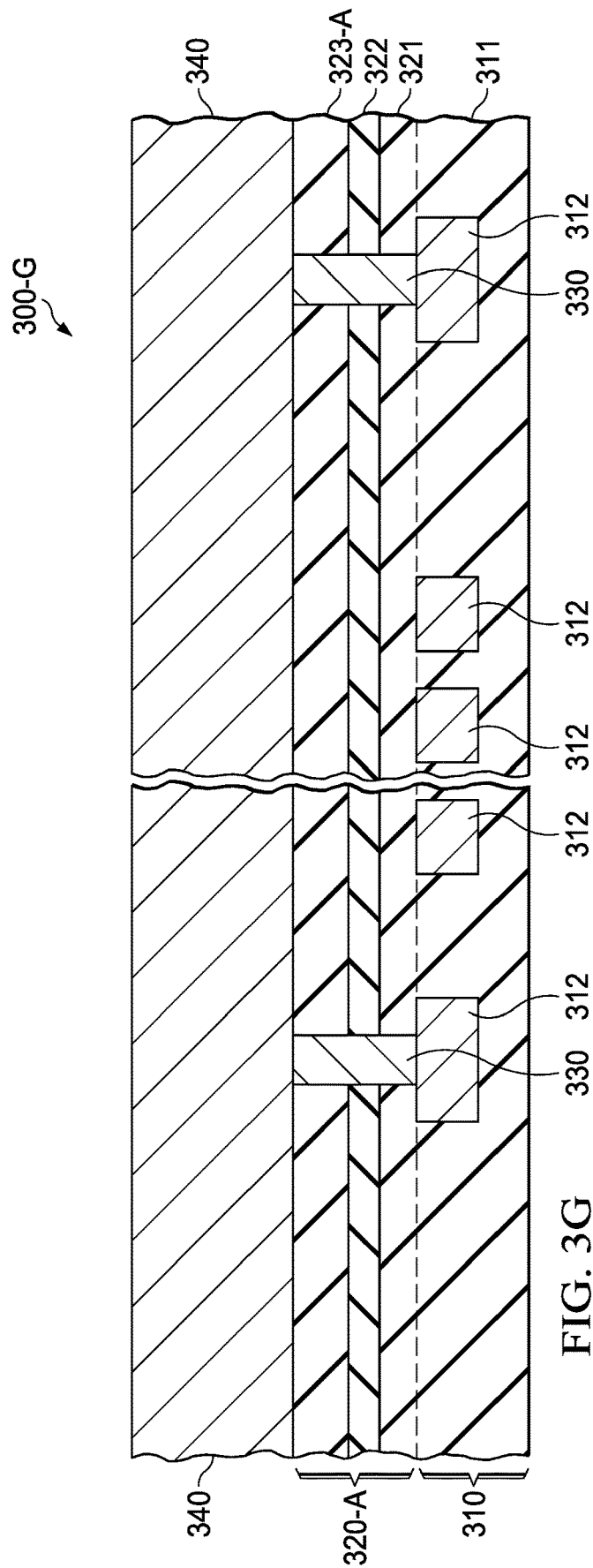
Figure 3H:
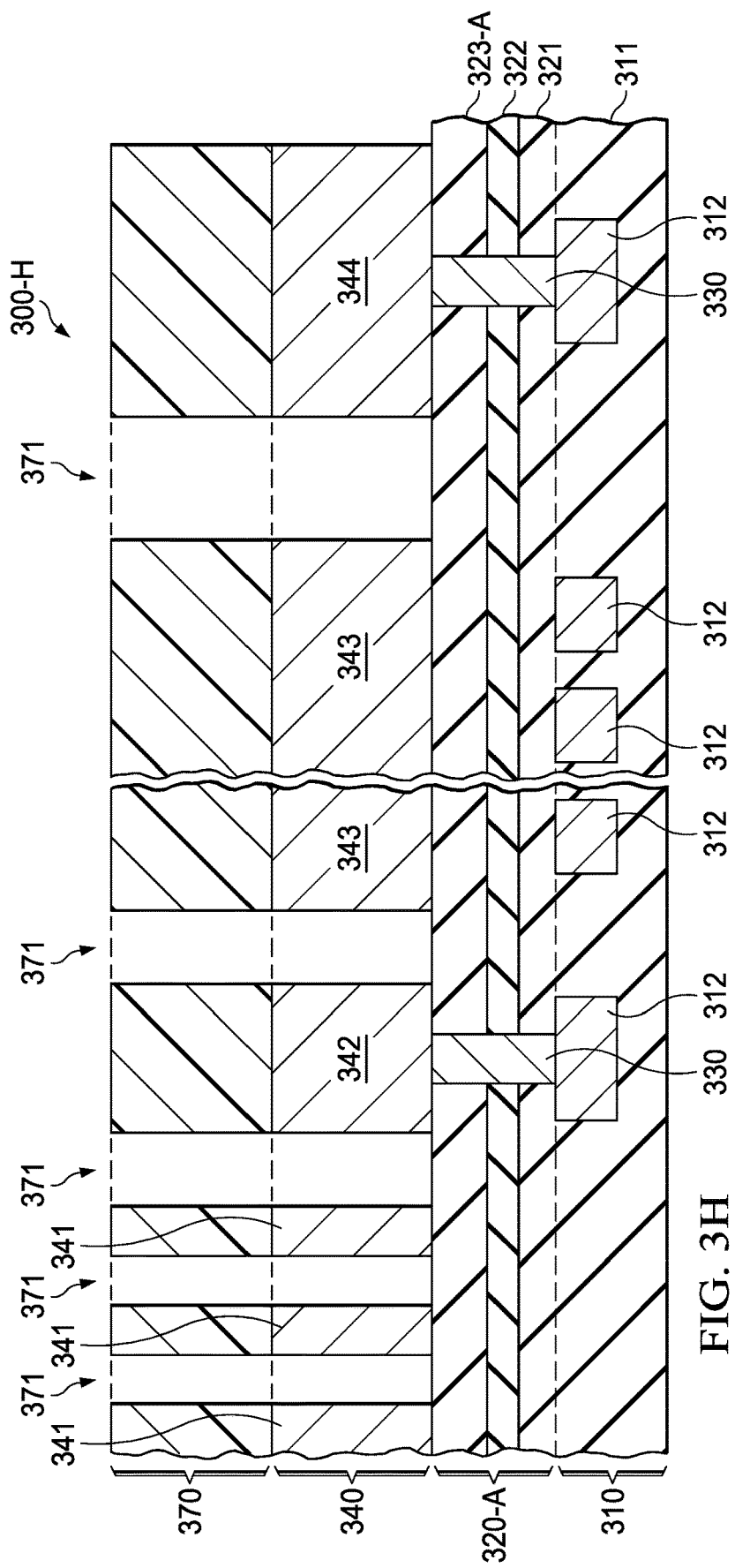
Figure 3I:
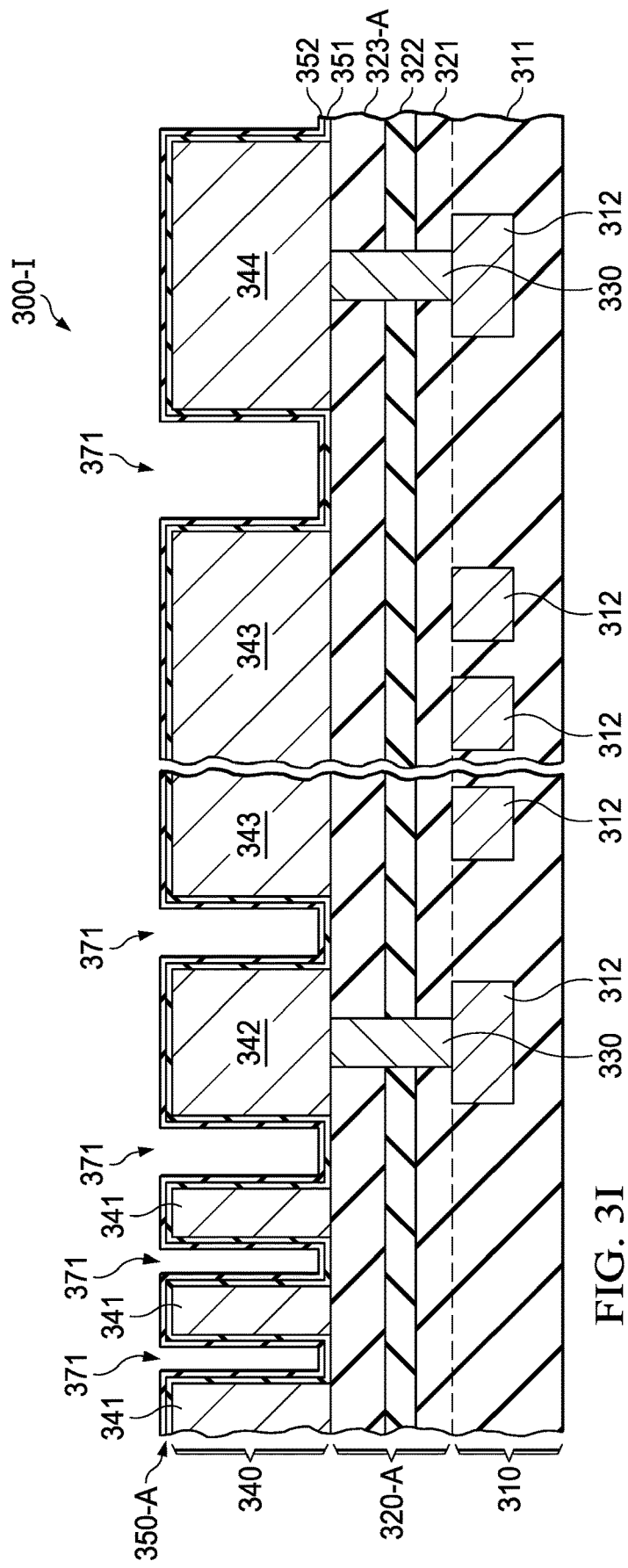

Next, as shown in FIG. 3G, a metal stack layer 340 is deposited over primary passivation layer 320-A of intermediate device 300-F, including the one or more conductive vias 330, yielding intermediate device 300-G. Subsequently, as illustrated in FIG. 311, the metal stack layer 340 of intermediate device 300-G is patterned with photoresist 370 and plasma etched to remove portions of the metal stack layer in regions 371; the remaining portions of the metal stack layer 340 form the metal fingers 341 of an interdigitated capacitor, capacitor terminals 342 (one shown), metal shield 343 and bond pads 344 (one shown). This process yields intermediate device 300-H.

Next, as illustrated in FIG. 31, the photoresist 370 is removed from intermediate device 300-H and a secondary passivation layer 350-A is continuously formed over the remaining portions of the metal stack layer 340 and the portions of the primary passivation layer 320-A that were exposed by the removal of portions of the metal stack layer in regions 371. This yields intermediate device 300-I. The secondary passivation barrier 350-A can include multiple layers; for example, a first layer of silicon oxide (SiO) 351 and a second layer of silicon nitride (SiN) 352 over the first layer.

Figure 3J:
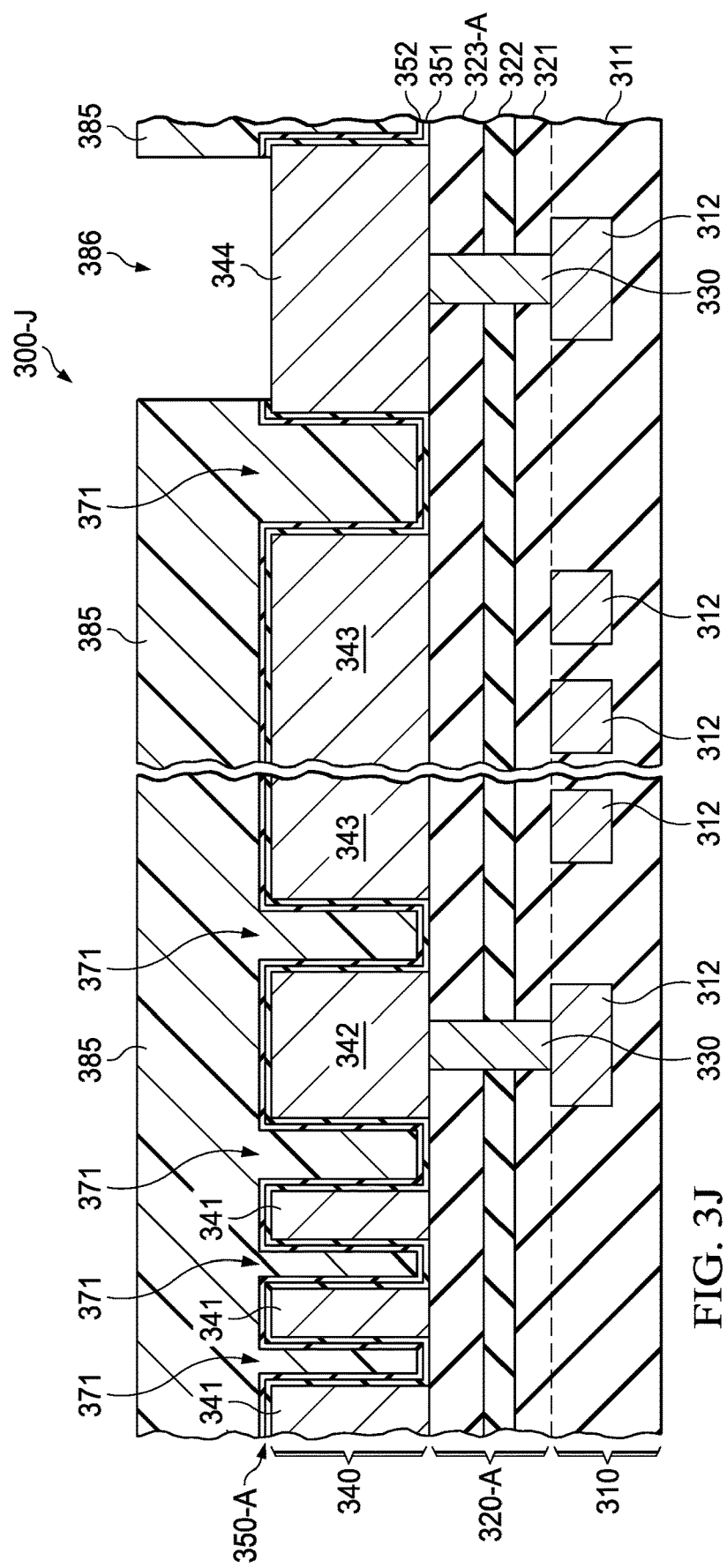
Figure 3K:
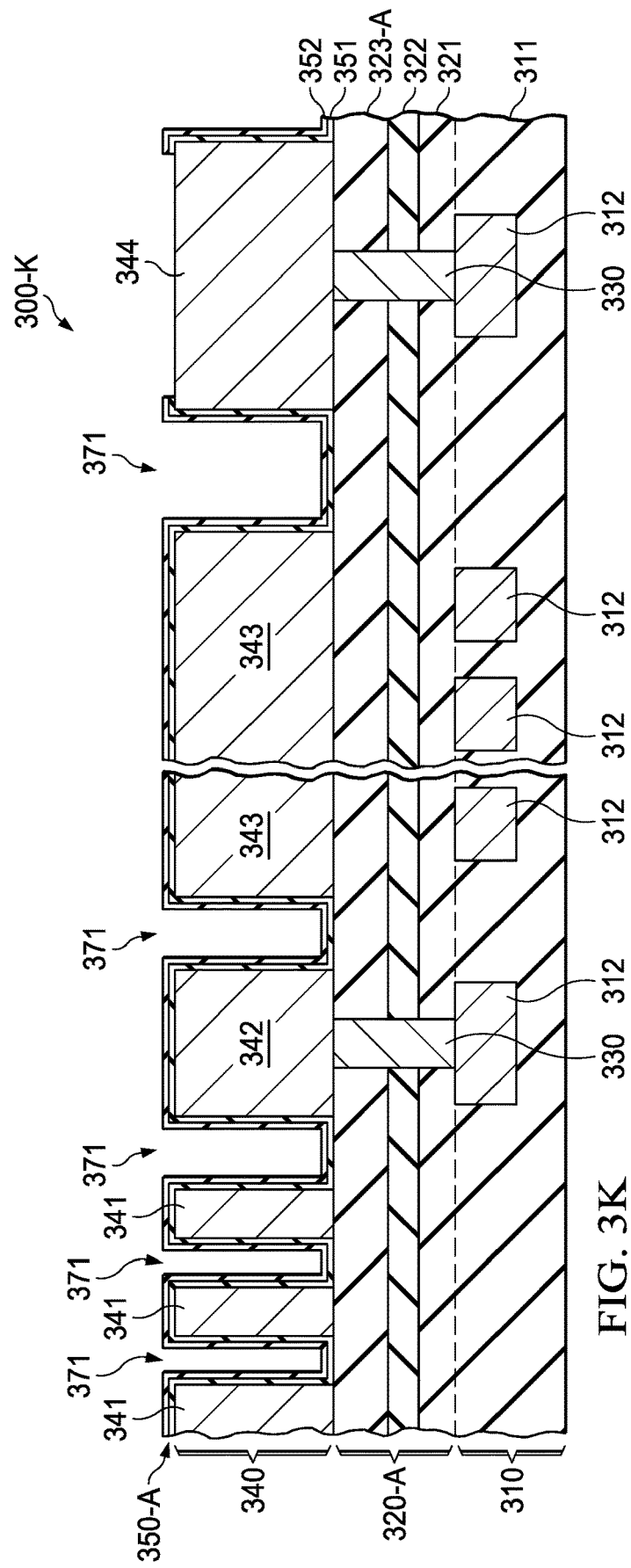

Next, as shown in FIG. 3J, the intermediate device 300-I is patterned with a photoresist 385 and then etched to remove the secondary passivation layer 350-A over the bond pads 344 (one shown) to allow later electrical connections to the device during assembly and packaging steps. Subsequently, as illustrated in FIG. 3K, the remaining photoresist 385 is removed from intermediate device 300-J, yielding intermediate device 300-K. At this stage, a thermal bake can be performed and the circuitry within circuitry layer 310 tested.

Figure 3L:
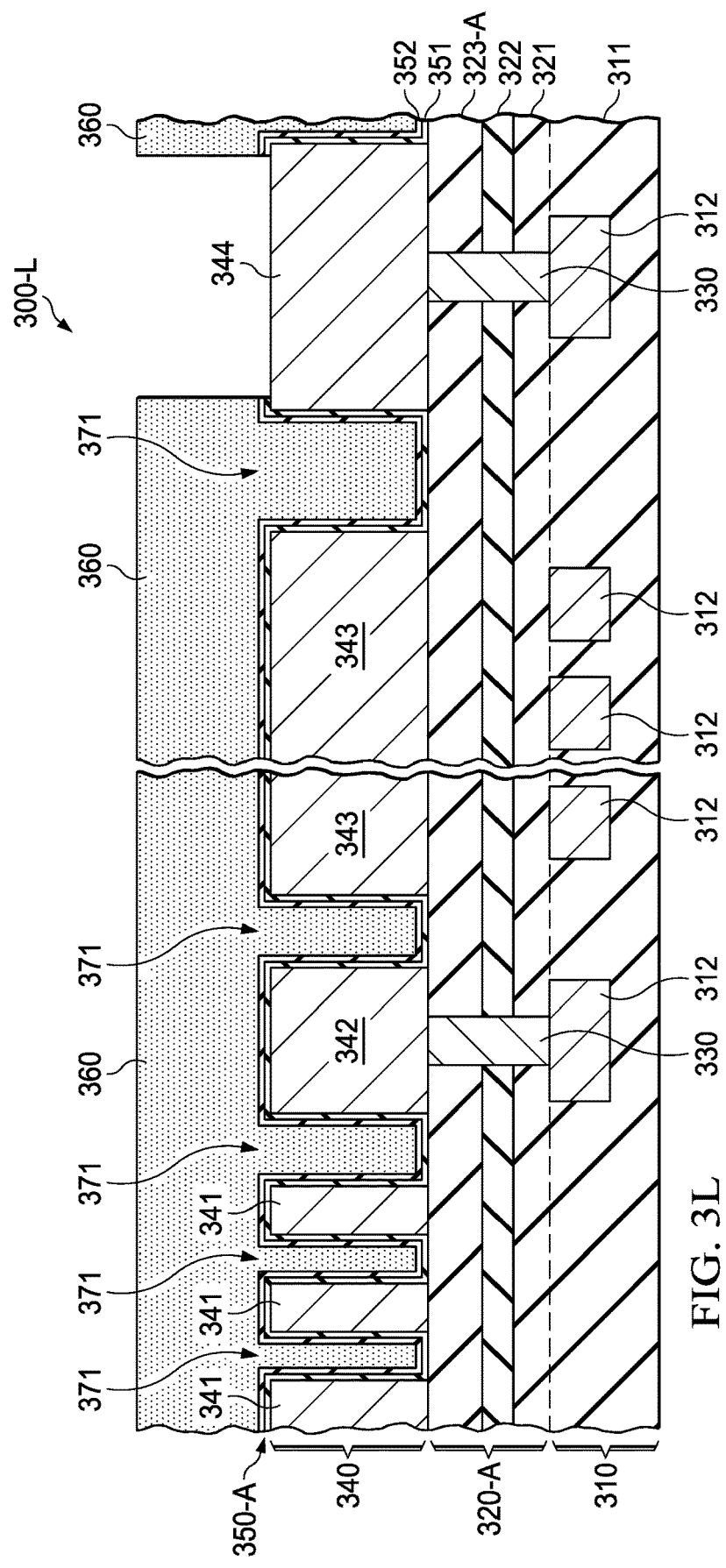

Finally, with reference to FIG. 3L, a hygroscopic material layer 360, such as polyimide (PI), is then deposited over the secondary passivation barrier 350-A, covering at least the metal fingers 341 of the interdigitated capacitor and filling the spaces 371 therebetween; if the hygroscopic material layer 360 is deposited over other areas, it can be etched to open desired regions, for example, over bond pad 344—either through the use of a photoactive polyimide material or a non-photoactive polyimide followed by a pattern and etch of the polymer and the resist removal. These final processes yield device 300-L which is structurally and functionally equivalent to sensor device 200-A illustrated in FIG. 2A.

The technical principles disclosed herein provide a foundation for designing monolithic humidity sensor devices and methods of manufacture thereof. In particular, the disclosed designs limit, if not eliminate, the potential for degradation of the integral circuitry due to moisture ingression. The examples presented herein illustrate the application of the technical principles and are not intended to be exhaustive, and the claims are not intended to be limited to the specifically-disclosed device topologies or methods of manufacture.

We claim:

1. A method of forming an integrated circuit, comprising the steps of:
    forming circuitry on or over a silicon substrate, the circuitry including top-level metal interconnects;
    forming a primary passivation barrier over said top-level metal interconnects;
    forming conductive vias through said primary passivation barrier to said top-level metal interconnects;
    forming a capacitor above said primary passivation barrier and electrically coupling said capacitor through said conductive vias to said circuitry, said capacitor comprising interdigitated metal fingers with spaces therebetween;
    forming a secondary passivation barrier over said capacitor; and,
    forming a hygroscopic material layer over said secondary passivation barrier, wherein said capacitor is operable to exhibit a capacitance value responsive to moisture present in said hygroscopic material layer and said circuitry is operable to generate a signal responsive to said capacitance value.

2. The method recited in claim 1, wherein said primary and secondary passivation barriers comprise at least one dielectric moisture barrier layer.

3. The method recited in claim 2, wherein said dielectric moisture barrier layer comprises silicon oxynitride.

4. The method recited in claim 1, further comprising recessing an upper portion of said primary passivation barrier under said spaces to a level below bottom surfaces of said metal fingers prior to forming said hygroscopic material layer.

5. The method recited in claim 4, further comprising recessing said secondary passivation barrier to a level below bottom surfaces of said metal fingers.

6. The method recited in claim 1, further comprising forming a metal shield layer above said circuitry, wherein said metal shield layer surrounds at least a portion of said capacitor.

7. The method recited in claim 6, wherein said metal shield layer is formed from a same metal layer as said metal fingers.

8. The method recited in claim 1, wherein said conductive vias comprise a barrier metal filled with tungsten.

9. An integrated circuit, comprising:
    a silicon substrate;
    circuitry on or over said silicon substrate, the circuitry including top-level metal interconnects;
    a primary passivation barrier over said top-level metal interconnects;
    conductive vias through said primary passivation barrier to said top-level metal interconnects;
    a capacitor above said primary passivation barrier and electrically coupled through said conductive vias to said circuitry, said capacitor comprising interdigitated metal fingers with spaces therebetween;
    a secondary passivation barrier over said capacitor; and,
    a hygroscopic material layer over said secondary passivation barrier, wherein said capacitor is operable to exhibit a capacitance value responsive to moisture present in said hygroscopic material layer and said circuitry is operable to generate a signal responsive to said capacitance value.

10. The integrated circuit recited in claim 9, wherein said primary and secondary passivation barriers comprise at least one dielectric moisture barrier layer.

11. The integrated circuit recited in claim 10, wherein said dielectric moisture barrier layer comprises silicon oxynitride.

12. The integrated circuit recited in claim 9, wherein an upper portion of said primary passivation barrier under said spaces is recessed to a level below bottom surfaces of said metal fingers.

13. The integrated circuit recited in claim 10, wherein said secondary passivation barrier under said spaces is recessed to a level below bottom surfaces of said metal fingers.

14. The integrated circuit recited in claim 9, further comprising a metal shield layer above said circuitry, wherein said metal shield layer surrounds at least a portion of said capacitor.

15. The integrated circuit recited in claim 14, wherein said metal shield layer is formed from a same metal layer as said metal fingers.

16. The integrated circuit recited in claim 9, wherein said conductive vias comprise a barrier metal filled with tungsten.

17. An integrated circuit, comprising:
    a circuitry layer over a semiconductor substrate, the circuitry layer including metal interconnects;
    a planarized passivation layer over the circuitry layer;
    an interdigitated capacitor over the passivation layer, the interdigitated capacitor including a plurality of metal lines configured as a first capacitor electrode and a second capacitor electrode; and
    one or more vertical interconnections that connect at least one of the first and second capacitor electrodes to the circuitry layer through the passivation layer.

18. The integrated circuit of claim 17, further comprising a hygroscopic material over, and filling spaces between, the metal lines.

19. The integrated circuit of claim 18, wherein the hygroscopic material is a polyimide.

20. The integrated circuit of claim 17, further comprising a dielectric moisture barrier over the plurality of metal lines.

* * * * *